(12) United States Patent
Sellers

(10) Patent No.: US 6,863,789 B2
(45) Date of Patent: *Mar. 8, 2005

(54) PASSIVE BIPOLAR ARC CONTROL SYSTEM AND METHOD

(75) Inventor: Jeff C. Sellers, Manchaca, TX (US)

(73) Assignee: ENI Technology, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/341,078

(22) Filed: Jan. 13, 2003

(65) Prior Publication Data

US 2003/0146083 A1 Aug. 7, 2003

Related U.S. Application Data

(63) Continuation of application No. 09/678,993, filed on Oct. 4, 2000, now Pat. No. 6,524,455.

(51) Int. Cl.⁷ .............................................. C23C 14/34
(52) U.S. Cl. .................................................. 204/298.08
(58) Field of Search ........................ 204/298.01, 298.02, 204/298.08, 298.1, 298.2, 298.8

(56) References Cited

U.S. PATENT DOCUMENTS

| | | |
|---|---|---|
| 5,505,835 A | 4/1996 | Sakaue et al. |
| 5,584,974 A | 12/1996 | Sellers |
| 5,616,224 A | 4/1997 | Boling |
| 5,645,698 A | 7/1997 | Okano |
| 5,651,865 A | 7/1997 | Sellers |
| 5,718,813 A | 2/1998 | Drummond et al. |
| 5,729,119 A | 3/1998 | Barbour |
| 5,770,023 A | 6/1998 | Sellers |
| 5,796,214 A | 8/1998 | Nerone |
| 6,001,224 A | 12/1999 | Drummond et al. |
| 6,524,455 B1 * | 2/2003 | Sellers .................. 204/298.08 |

FOREIGN PATENT DOCUMENTS

JP 07 188 919 A 7/1995

* cited by examiner

Primary Examiner—Gregg Cantelmo
(74) Attorney, Agent, or Firm—Harness, Dickey & Pierce, P.L.C.

(57) ABSTRACT

An arc control system includes a sputtering chamber that houses an anode and a sputtering target formed from a target material and serving as a cathode. A DC power supply provides a DC voltage between the cathode and anode such that a cathode current flows from the anode to the cathode. A resonant network is coupled between the DC power supply and the chamber. The resonant network has sufficient Q so that in reaction to an arc, the cathode current resonates through zero, causing a positive voltage to be applied between the cathode and anode. A reverse voltage clamp is coupled across the resonant network to clamp the cathode voltage to a predetermined reverse voltage. The reverse cathode voltage inhibits subsequent arcing by positively charging insulated deposits on the sputtering target. The arc control system limits the quantity of energy that is dissipated by the arc.

6 Claims, 3 Drawing Sheets

PASSIVE BIPOLAR ARC CONTROL SYSTEM AND METHOD

CROSS-REFERENCE TO RELATED APPLICATIONS

This application is a continuation of U.S. patent application Ser. No. 09/678,993, filed on Oct. 4, 2000, now U.S. Pat. No. 6,524,455, issued Feb. 25, 2003. The disclosure of the above application is incorporated in its entirety herein by reference.

BACKGROUND AND SUMMARY OF THE INVENTION

The present invention relates generally to plasma-based thin film processing. More particularly, the invention relates to an arc control apparatus for DC sputtering systems that decreases the recovery time from an arc.

With the increasing demand for optical and disk media such as CD, DVD, MD, MO, DLC films, and hard disks; the importance of the sputtering processes that are used in the manufacture of these media continues to increase. There are numerous types of sputtering systems, all of which are employed to deposit insulating or conductive coatings on devices ranging from semiconductors to drill bits. The films that are generally applied to optical and disk media are typically created with a sputtering process having poor control over the sputtering gas, i.e. a significant fraction of atmosphere and petrochemical volatilities are in the chamber at the beginning of the process.

During the initial sputtering phase, atmosphere is introduced into the plasma chamber to combine with freed target material. The resulting compound, typically oxides and nitrides, may form a film on the surface of the target. This is referred to as target poisoning, and will cause arcing in DC sputtering. Arcing, though inevitable in these processes is a mixed blessing. The arc often removes the poisoning from the target, but it may also generate undesirable particles to damage the substrate or disk.

Further sources of arcing include contaminants such as moisture, atmospheric gases, inclusions, and outgassing from the workpiece may also cause arcing.

In addition to particulate defects, arcing may lead to a defect commonly known as "mousebites", which is illustrated in FIG. 1. A mousebite 9 is an irregularity that generally occurs along the edges of a workpiece coating. The occurrence of mousebites is related to the configuration of the power supply and attached energy storage components. In applications such as coating CDs, the effect of mousebites can be attenuated by increasing the portion of the workpiece adjacent to the edges that is masked from coating. However, masking limits the usable area of the workpiece, thereby increasing the need for maintenance, i.e. replacement of the mask due to coating buildup.

To control arcs, conventional DC sputtering systems include arc suppression systems that are either attached to or integrated into the power supply. Arc suppression systems may be divided into two groups. The first type, periodic arc control systems, cause a periodically occurring interruption or voltage reversal of the cathode voltage in an attempt to avoid arcing. The second type, arc initiated control systems, bring about an interruption only after the beginning of an arc has been detected.

Periodic suppression systems universally employ at least one active switch (in shunt or series to the cathode) to interrupt the flow of current or to apply a reverse voltage to the cathode. The frequency and pulse width of the switch are normally set so that arcing is suppressed, thereby eliminating defects that result from target poisoning and its associated arcs. A disadvantage of periodically interrupting the cathode voltage is that the basic deposition rate may be reduced since the cathode voltage is not continuously applied. Another disadvantage of periodic suppression systems is the additional cost of the active devices and associated control circuits. Generally, periodic suppression systems are only employed when defect free deposition is required, such as in the manufacture of semiconductors.

Arc initiated control is employed for the manufacture of devices in which lower cost and reduced deposition times are the primary requirements. Traditionally, an arc initiated control system senses the initiation of an arc, and in response disables the power supply driving the cathode. Generally, these control systems permit a significant quantity of energy to be dissipated in the arc before disabling the power applied to the cathode. The quantity of energy dissipated in the arc is also dependent on the type of power supply to which the arc initiated control system is attached. Since arc control systems do not completely prevent arcing like periodic suppression systems, but instead act in response to the detection of an arc, particulate defects to varying degrees will occur. In addition, with some combinations of power supplies and arc initiated control systems, mousebite defects may also occur. In addition, deposition times may also be adversely affected, since while an arc occurs there is no deposition on the substrate.

While the prior art can be used to provide a DC sputtering system, it has not proven capable of providing low cost arc control that does not adversely affect the deposition time or the quality of the coating. Accordingly, it is desirable to provide a low defect arc control system that does not compromise the deposition rate of the process. In addition, eliminating defects from the workpiece is desirable. Also, it is desirable to reduce deposition defects caused by target poisoning.

The present arc control system and method provide a system for controlling an arc. The arc control system includes a sputtering chamber that houses an anode and a sputtering target formed from a target material and serving as a cathode. A DC power supply provides a DC cathode voltage such that a cathode current flows from the anode to the cathode. A resonant network is coupled between the DC power supply and the chamber. The resonant network has sufficient Q so that in reaction to the occurrence of an arc, the cathode current resonates to a negative value as is well known in the art. A reverse voltage clamp is coupled across the resonant network to clamp the cathode voltage to a predetermined reverse voltage value, and allow the negative portion of the resonant waveform to drive the cathode and reverse charge the target surface. Thus reverse current of the network is allowed to flow unimpeded to the cathode. This reverse current then charges the cathode to a clamped positive voltage.

For a more complete understanding of the invention, its objects and advantages, reference may be had to the following specification and to the accompanying drawings.

DETAILED DESCRIPTION OF THE PREFERRED EMBODIMENT

Figure 1:
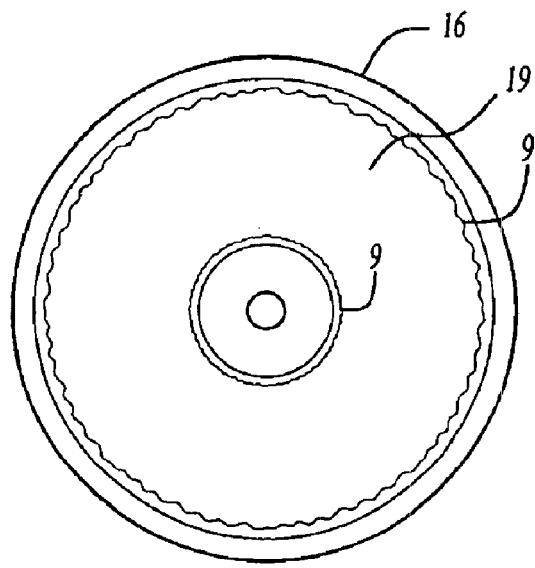
FIG. 1 illustrates an exemplary workpiece having mousebites.
Figure 2:
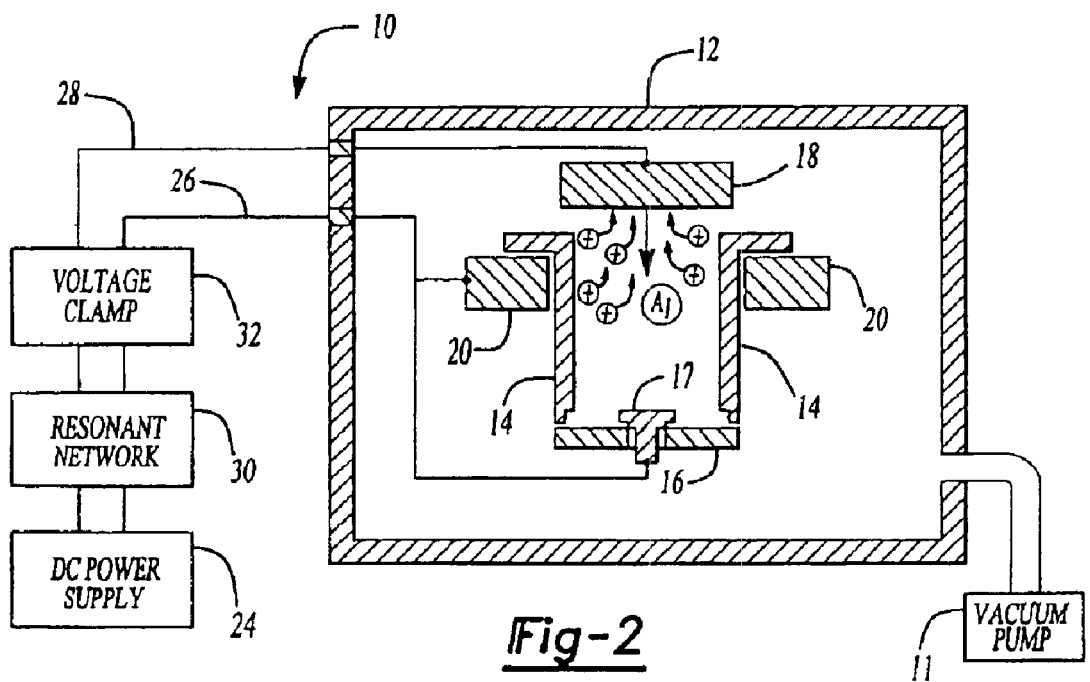
FIG. 2 is a block diagram of a sputtering system constructed in accordance with the teachings of the invention.

Referring to FIG. 2, a DC sputtering system 10 according to the present invention is shown. In the presently preferred embodiment of the invention, the DC sputtering system 10 uses a DC sputtering process to deposit a coating on a workpiece 16. Although, the workpiece in the present embodiment is an optical disk storage media such as CDs and DVDs, it is within the scope of the invention to coat other items such as drill bits, glass panels, toys, cutting tools, optical equipment for any substrate, or a sputtered thin film. This process is unusual in that there typically is about 50 percent atmosphere in the sputtering chamber at the beginning of the deposition process. The oxygen and nitrogen of the air may convert some aluminum deposition to a Al2O3 and AlN deposition for the first part of the run. During the early portion of this process, arcing may occur due to outgassing, atmosphere contamination, etc.

The sputtering system 10 includes a sputtering chamber 12 that provides a controlled environment for the deposition process. A vacuum pump 11 is typically used to maintain the sputtering chamber 12 at a controlled pressure. The workpiece 16 may be a CD, DVD, cutting blade, or other item to be coated. A sputtering target 18, configured as a cathode, serves as a source of material for the coating. In the presently preferred embodiment the target 18 is formed from aluminum, although other suitable materials and alloys such as Gold, Si, Ta, B, and Ti may be used. Another piece of conductive material within the sputtering chamber 12 serves as an anode 20. The cathode 18 and anode 20 are coupled to a DC power supply 24 which supplies electrical energy for inducing a plasma within the sputtering chamber 12. In the presently preferred embodiment the atmospheric gas introduced at the start of the process is a contaminant. A controlled amount of a sputtering gas, for providing anions that flow within the plasma, is also supplied to the sputtering chamber 12. Typically argon or another noble gas is used as the sputtering gas.

For this particular application of the invention, wherein an optical disk is coated, a pair of shields are included in the chamber 12 for masking the outer and inner edges of the optical disk that is used as the workpiece 16. The shields provide well defined outer and inner radii for the optical disk. An outer shield 14 is positioned between the target material 18 and the optical disk 16 to prevent the deposition of coating material on the outer edge. An inner shield 17 is likewise positioned to prevent coating of the inner edge of the optical disk.

The DC power supply 24 provides electrical energy for the sputtering process. The power supply 24 converts unregulated AC line power to regulated DC power suitable for powering the sputtering system 10. In the presently preferred embodiment of the invention, the DC power supply 24 is a switch mode power supply, however, the scope of the invention is not limited by the type of power supply. For example, other types of power supplies such as SCR and diode-transformer power supplies may be used. The positive 26 and negative 28 outputs of the DC power supply 24 are coupled to the anode 20 and cathode 18, respectively. The power supply 24 provides the required voltage/current to the sputtering chamber 12. As will be recognized by those skilled in the art, the nominal voltage is to be suitable for the target material and sputtering operation to be performed. Therefore, the scope of the invention includes sputtering processes employing a wide range of voltages. A resonant network 30 and voltage clamp 32 are connected between the DC power supply 24 and the cathode 18 and anode 20. The resonant network 30 stores electrical energy that drives a voltage reversal at the cathode 18 and anode 20 during an arc event. Although, the resonant network 30 is illustrated as being separate from the power supply 24, it is within the scope of the invention to integrate the resonant network 30 into the power supply 24. Indeed, as will be subsequently explained, the performance of the resonant network 30 is correlated to the output filter of power supply 24. The voltage clamp 32 limits the amplitude of the voltage reversal that is applied across the cathode 18 and anode 20 during an arc and may additionally be configured to clamp excess normal voltages to protect the power supply 24 and the workpieces 16.

Figure 3:
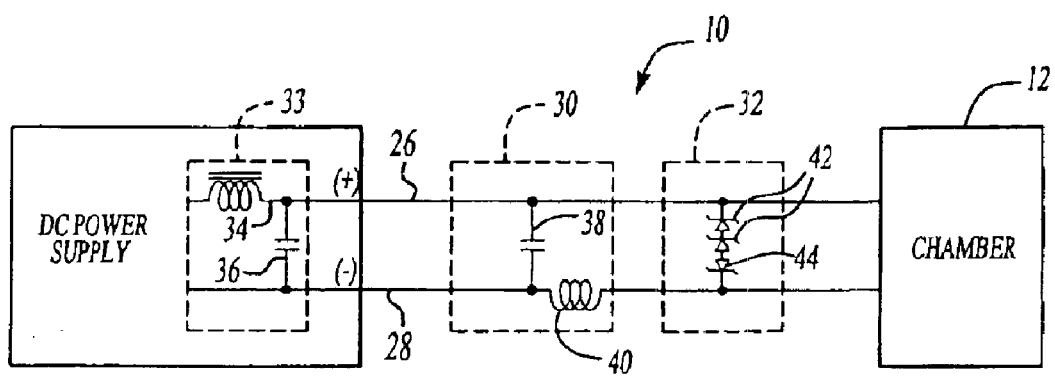
FIG. 3 is a schematic diagram of a presently preferred embodiment of the invention.

Referring to FIG. 3, a partial electrical schematic of the presently preferred embodiment of the sputtering system 10 is illustrated. The DC power supply 24 includes, in addition to other elements, an output filter 33 that comprises an output inductor 34 and an output capacitor 36. Those skilled in the art will recognize that there are multiple output filter configurations that will operate with the claimed invention. For example, multiple stage filters, damped output filters, and high impedance output filters are all within the scope of the invention.

The resonant network 30 is configured to store energy during normal system 10 operation. The stored energy is subsequently released to the sputtering chamber 12 during an arc occurrence to enhance the system response. A resonant capacitor 38 is connected across the positive and negative outputs 26 and 28 of the DC power supply 24. In the presently preferred embodiment, a 0.1 $\mu$F polypropylene film capacitor is used for the resonant capacitor 38, although many values may be used dependent on the output design of the power supply 24 and magnetron cathode 18. A resonant inductor 40 is connected from the resonant capacitor 38 to voltage clamp 32. The resonant inductor 40 stores energy to be used in response to an arc, and also limits the rate of increase in output current during an arc. In the presently preferred embodiment, the resonant inductor 40 is 12 $\mu$H, though other values may be used.

Figures 3A, 3B:
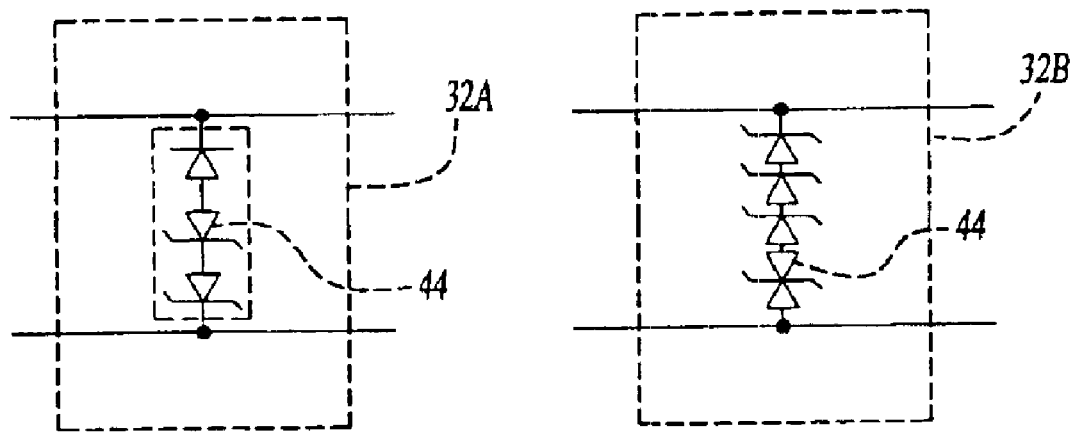
FIG. 3A is a schematic diagram of a voltage clamp.
FIG. 3B is a schematic diagram of another voltage clamp.

The voltage clamp 32 limits the amplitude of the voltage applied to the sputtering chamber 12. The voltage clamp 32 includes a reverse voltage clamping device 44 connected from cathode 18 to anode 20. The reverse voltage clamping device 44 limits the reverse voltage applied to the sputtering chamber 12 to a level that aids in extinguishing the arc but low enough to prevent back sputtering or mousebites. In the presently preferred embodiment of the invention, a forward voltage clamping device 42 is connected in series with the reverse voltage clamping device 44, however the scope of the invention encompasses connecting a reverse voltage clamping device 44 in parallel with a forward clamping device 42 as well as a reverse voltage clamping device 44 with no forward clamping device (see FIG. 3A, voltage clamp 32A). In the presently preferred embodiment the reverse voltage clamping device 44 is a uni-directional zener diode (transorb) in series with the forward voltage clamping device 42. Two less preferred implementations are illustrated in FIGS. 3A and 3B as voltage clamps 32A and 32B. In voltage clamp 32A, the reverse voltage clamping device 44 is a series of unidirectional zener diodes in series with a reverse biased diode. In voltage clamp 32B, the reverse voltage clamping device is a bi-directional zener diode that is in series with a string of unidirectional zener diodes.

The forward voltage clamping device 42 protects the sputtering system 10 from excessive forward output voltages. The selection and implementation of forward voltage clamping devices is well-known to those skilled in the art. In presently preferred embodiment a series of unidirectional zener diodes are used as the forward voltage clamping device.

Actual deposition of the coating requires the ignition of a plasma within the sputtering chamber 12. The plasma is created by applying a voltage between the anode 20 and the cathode 18 that is sufficiently high to cause ionization of at least a portion of the sputtering gas. The intense electric field associated with the applied voltage strips electrons from the gas atoms, creating anions and electrons that flow within the plasma. The anions are accelerated by the steady-state electric field into the target 18 with sufficient kinetic energy to cause the anions to knock atoms from the target 18. Some of the freed target atoms combine with atmosphere that is present within the sputtering chamber 12 at the beginning of the process. The remaining freed target atoms that are uncombined also disperse throughout the sputtering chamber 12 coating the exposed surfaces. Throughout the process arcing occurs intermittently due to target poisoning, outgassing from the workpiece 16, contaminants, and flakes amongst other causes.

Figure 5:
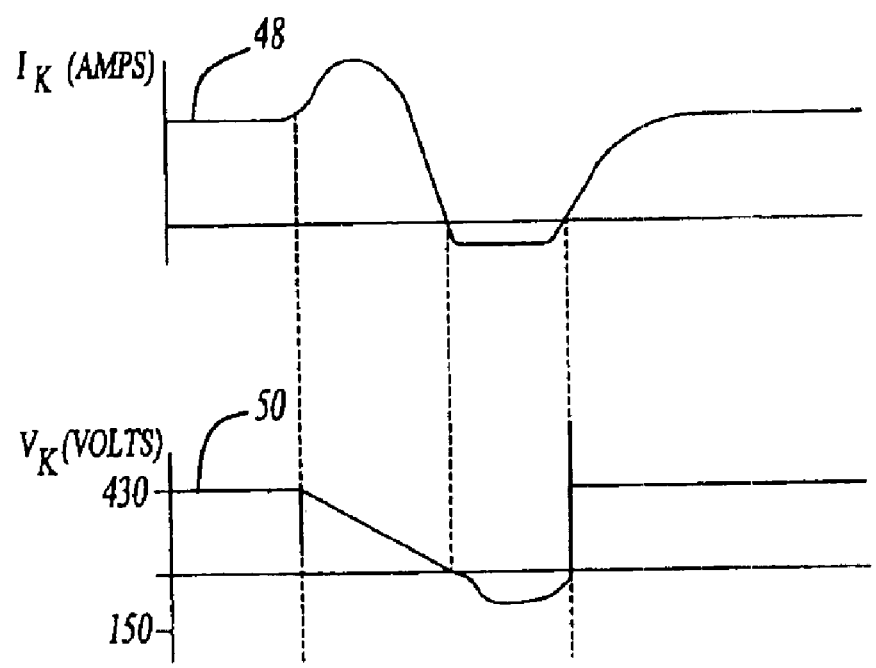
FIG. 5 is a signal diagram showing the cathode current and voltage waveforms associated with an arc.

Referring to FIGS. 3 and 5, the operation of the sputtering system 10 during an arc will be described. When an arc occurs, the impedance from cathode 18 to anode 20 dramatically decreases, causing a rapid rise in cathode current 48. The increase in cathode current 48 is supplied from energy stored in the output capacitor 36 and resonant capacitor 38. As the transient current continues to flow, energy stored in the output capacitor 36 and resonant capacitor 38 transfers into the resonant inductor 40. The cathode current 48 reaches a peak value when the voltage across capacitors 36 and 38 resonates to 0. As those skilled in the art will realize, the peak value of the cathode current 48 is related to the ratio of the energy stored in resonant inductor 40 and capacitors 36 and 38. This ratio is commonly referred to as the Q of the filter. As the cathode current 48 begins to decrease, energy starts to transfer out of resonant inductor 40 back into capacitors 36 and 38, reverse charging the capacitors. The voltage applied from cathode 18 to anode 20, cathode voltage 50, reverses as charge continues to flow into capacitors 36 and 38. Thus, resonant inductor 40 and capacitors 36 and 38 have a Q such that in reaction to the occurrence of an arc, the cathode current 48 resonates to a reverse current level.

The amplitude of the reverse voltage applied to the cathode 18 continues to increase until the reverse voltage clamping device 44 becomes active. One prior technique allows this voltage to reverse to a nearly equal value of the normal cathode voltage, (+500 volts to −500 volts). Another prior technique clamps the negative voltage at or about zero volts, allowing no reverse current to flow to the cathode. In the presently preferred embodiment, the reverse voltage clamping device 44 is preferably selected to clamp the cathode 18 to a voltage less than 200V. The present invention recognizes that mousebites are caused by substantial reverse power flow through the anode 20. Therefore, for mousebites to occur, there must be substantial reverse voltage in addition to reverse current applied to the cathode 18. Mousebites are caused by back sputtering from the workpiece when a sufficient reverse voltage and current are applied. In the present embodiment, back sputtering begins to occur at reverse voltage levels of 200 volts or greater. The mousebites occur at the boundaries of the workpiece because these are the locations of the highest electric field intensity, and therefore the first locations to breakdown the reactive gas and allow reverse current flow. It is within the scope of the invention to select a clamping voltage for the clamping device 44 that is sufficient to extinguish arcing but is less than the back sputtering voltage that will cause mousebites.

The present invention also recognizes that providing a reverse voltage less than the sputtering voltage during an arc may reduce the recovery time of the sputtering system 10. The reverse voltage applied to the cathode 18 aids in extinguishing the arc. In the presently preferred embodiment, the sputtering system 10 recovers from an arc within about 6 μsecs. In addition, less energy is dissipated in the arc since a portion of the energy from the energy storage components is dissipated within the reverse voltage clamping device 44. The quantity of particulate defects generated by the arc is reduced since less energy is dissipated within the arc and the duration of the arc is shortened. Also, applying a reverse voltage to the cathode 18 reduces the tendency for subsequent arcing during reactive deposition processes by reducing the charge stored by the parasitic capacitance formed from the target material and insulator compounds.

After the arc is extinguished, the cathode current continues to resonate. As the cathode current 48 passes through zero amps, the cathode voltage 50 reestablishes the sputtering voltage and power.

Figure 4A:
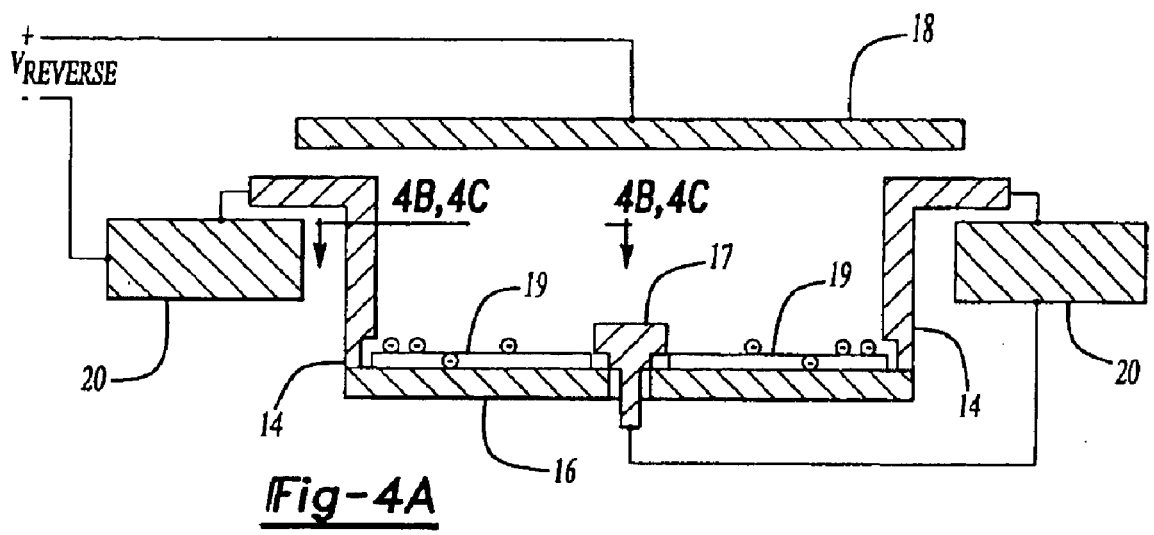
FIG. 4A illustrates a sputtering system during a voltage reversal.
Figure 4B:
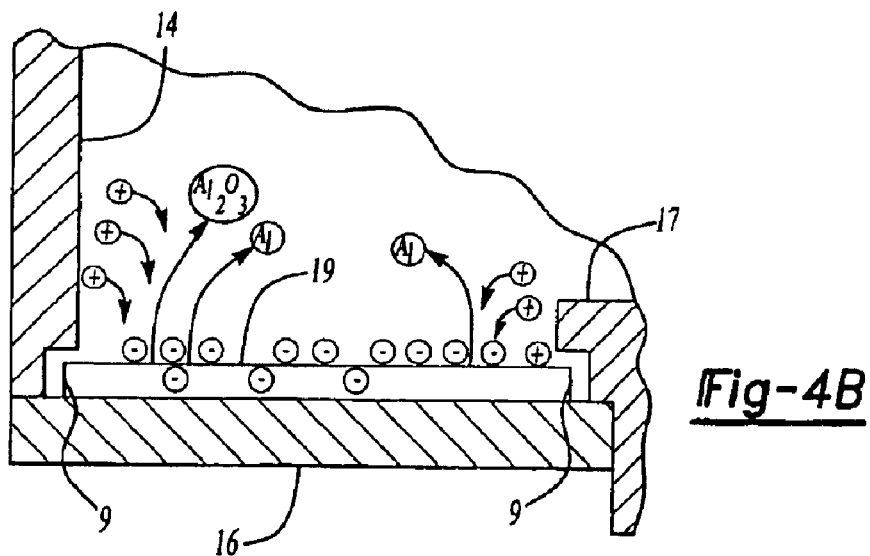
FIG. 4B illustrates a conventional sputtering system during a voltage reversal.
Figure 4C:
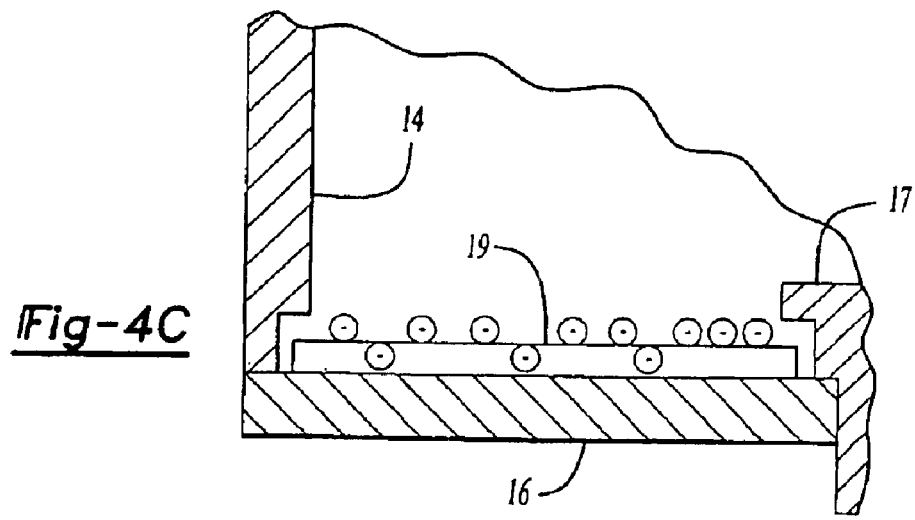
FIG. 4C illustrates a sputtering system in accordance with the principles of the present invention during a voltage reversal.

Referring to FIGS. 4A, 4B, and 4C, the state of the sputtering system 10 during a voltage reversal is contrasted with conventional sputtering systems. FIG. 4B illustrates the operation of a conventional sputtering system during a voltage reversal. FIG. 4C illustrates the operation of the presently preferred embodiment of the sputtering system 10 during a voltage reversal. During normal operation, prior to an arc occurring, target material sputtered off from the cathode 18 forms a coating 19 on the workpiece 16. As the coating 19 is formed, a low-level negative charge accumulates within the coating 19 as well as along the surface of the coating 19. When a voltage reversal occurs, the voltage on the cathode 18 swings positive relative to the anode 20. Positive anions that previously were attracted to the cathode 18 are increasingly repelled as the reverse voltage increases in magnitude.

In conventional sputtering systems (see FIG. 4B), the positive anions instead of flowing towards the cathode 18, increasingly flow towards the negatively charged workpiece 16. As the anions flow towards the workpiece 16, they are attracted towards the outer and inner edges of the coating 19 due to the high electric fields present in those regions. When the anions strike the coating 19, momentum transfer occurs causing portions of the coating 19 to be back sputtered, with the majority of the sputtering occurring along the edges. Mousebites 9 are exhibited as the back sputtering along the edges of the coating 19 continues. The back sputtered coating 19 which comprises mainly aluminum with a smaller proportion of Al2O3, is deposited on the inner surfaces of the sputtering chamber 12 including the shields 14 and 17, and the cathode 18.

In the presently preferred embodiment of the sputtering system 10, the magnitude of the voltage reversal is clamped at a sufficiently low voltage to prevent the flow of positive anions towards the negatively charged workpiece 16. Since anions do not strike the coating 19, the mousebites 9 that plagued conventional sputtering systems are prevented from occurring in the presently preferred embodiment.

The arc control system of the present invention minimizes the time to recover from an arc, thereby increasing the proportion of process time during which deposition of material occurs. Additionally, the system prevents the formation of mousebites during an arc.

Also, the arc control system decreases the arc energy that is dissipated in the chamber, thereby reducing defects in the workpiece. In addition, the period of time before subsequent arcs occur is lengthened, again increasing the process time during which deposition of material occurs.

Further, the arc control system is designed with a comparatively small number of passive components.

Thus it will be appreciated from the above that as a result of the present invention, an arc control method for DC sputtering systems is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. An arc control system for responding loan arc in a DC sputtering system, comprising:
    a sputtering chamber that houses an anode and a sputtering target formed from a target material and serving as a cathode;
    a DC power supply configured to provide a direct current cathode voltage such that a cathode current flows through the anode and the cathode, the DC power supply having an output filter that includes an output inductor and an output capacitor;
    a first circuit branch coupled across the DC power supply, the first circuit branch comprising a resonant capacitor; and
    a second circuit branch coupled across the DC power supply in parallel with the first circuit branch, the second circuit branch comprising a resonant inductor in series with a parallel combination of a first circuit subbranch and a second circuit subbranch, wherein the first circuit subbranch comprises the sputtering chamber and the second circuit subbranch comprises a reverse voltage clamp;
    and further wherein the resonant capacitor and the resonant inductor comprise a resonant network configured to provide a Q such that in reaction to the occurrence of an arc, the cathode current resonates to a reverse current level and wherein the reverse voltage clamp is configured to clamp the cathode voltage to a predetermined clamp voltage and further wherein the output of the DC power supply does not vary in response to the occurrence of an arc.

2. The arc control system of claim 1 wherein the reverse voltage clamp comprises at least one zener diode in series with a reverse biased diode.

3. The arc control system of claim 1 further comprising a forward voltage clamp in series with the reverse voltage clamp, wherein the reverse voltage clamp comprises at least one bi-directional zener diode and the forward voltage clamp comprises at least one unidirectional zener diode.

4. The arc control system of claim 1 wherein the DC power supply is selected from the group of: SCR power supplies, switchmode power supplies, and diode-transformer power supplies.

5. The arc control system of claim 1 wherein the predetermined clamp voltage is less than a backsputtering voltage.

6. The arc control system of claim 2 wherein the DC sputtering system is a DC reactive sputtering system.

* * * * *

UNITED STATES PATENT AND TRADEMARK OFFICE
CERTIFICATE OF CORRECTION

PATENT NO. : 6,863,789 B2 Page 1 of 1
DATED : March 8, 2005
INVENTOR(S) : Jeff C. Sellers It is certified that error appears in the above-identified patent and that said Letters Patent is hereby corrected as shown below:

Column 7,
Line 36, "loan" should be -- to an --.

Signed and Sealed this

Seventh Day of June, 2005

JON W. DUDAS
*Director of the United States Patent and Trademark Office*